United States Patent [19]

Lee

[11] Patent Number: 5,742,547

[45] Date of Patent: Apr. 21, 1998

[54] CIRCUITS FOR BLOCK REDUNDANCY REPAIR OF INTEGRATED CIRCUIT MEMORY DEVICES

[75] Inventor: Seung-hun Lee, Kyungki-do, Rep. of Korea

[73] Assignee: Samsung Electronics Co., Ltd., Suwon, Rep. of Korea

[21] Appl. No.: 701,634

[22] Filed: Aug. 22, 1996

[30] Foreign Application Priority Data

Aug. 22, 1995 [KR] Rep. of Korea .................. 95-25987

[51] Int. Cl.$^6$ ............................................ G11C 7/00
[52] U.S. Cl. ................ 365/200; 365/230.03; 365/230.06; 365/225.7
[58] Field of Search ............... 365/200, 230.03, 365/230.06, 230.04, 225.7

[56] References Cited

U.S. PATENT DOCUMENTS

| | | | |
|---|---|---|---|
| 4,829,480 | 5/1989 | Seo ............................. | 365/200 |
| 5,270,975 | 12/1993 | McAdams ..................... | 365/200 |
| 5,295,101 | 3/1994 | Stephens, Jr. et al. .......... | 365/200 |
| 5,386,387 | 1/1995 | Tamizaki ....................... | 365/200 |

*Primary Examiner*—Vu A. Le
*Attorney, Agent, or Firm*—Myers Bigel Sibley & Sajovec

[57] ABSTRACT

A memory cell array includes a plurality of memory blocks, each of which includes normal memory cells and spare memory cells, arranged in arrays having rows and columns. A row or column of spare memory cells in one of the memory cell blocks is substituted for a defective row or column of normal memory cells in the one of the memory blocks, without substituting a row or column of spare memory cells in remaining ones of the memory cell blocks for a row or column of normal memory cells in the remaining ones of the memory blocks. Stated differently, a predetermined row or column of spare memory cells in a first one of the memory blocks is substituted for a first defective row or column of normal memory cells in the first one of the memory blocks, and the predetermined row or column of spare memory cells in a second one of the memory blocks is also substituted for a second defective row or column of normal memory cells in a second one of the memory blocks. Thus, a given row or column of spare memory cells can be used to substitute for different rows or columns of memory cells in each memory block. The number of spare memory cells which is required is thereby reduced.

4 Claims, 4 Drawing Sheets

CIRCUITS FOR BLOCK REDUNDANCY REPAIR OF INTEGRATED CIRCUIT MEMORY DEVICES

FIELD OF THE INVENTION

This invention relates to integrated circuit memory devices, and more particularly to redundancy systems and methods for repairing integrated circuit memory devices.

BACKGROUND OF THE INVENTION

As the integration density of memory devices increases, redundancy systems and methods are generally used. In general, redundancy systems and methods provide spare rows and/or spare columns of memory cells, and redundancy circuits for activating a spare row and/or column of memory cells. Accordingly, when an address signal specifying a memory cell of a defective row or a defective column is input, a spare row or column memory cell, rather than a normal memory cell, is selected by the input address signal.

As the integration density of memory devices increases, the occurrence of defective memory cells and the number of spare rows and spare columns generally increase, thus increasing the integrated circuit size. Therefore, it is desirable to obtain the maximum repair using a minimum number of spare rows and columns.

An example of a column repair system and method is disclosed in U.S. Pat. No. 4,829,480 entitled "*Column Redundancy Circuit for CMOS Dynamic Random Access Memory*", part of which is shown in FIG. 1. FIG. 1 shows an example in which 4 memory blocks MB0 through MB3 are included, to describe operation of the column redundancy circuit disclosed in U.S. Pat. No. 4,829,480.

Referring now to FIG. 1, the portion denoted by reference designation MA is a memory cell array which has four memory blocks MBi where i=0, 1, 2 and 3. The memory blocks MBi share a row decoder and a column decoder. The respective memory blocks MB0–MB3 can be selected using two bits among the remaining bits excluding the bits provided to select a word line in a memory cell array MA in an address signal supplied from an address buffer (not shown) to the row decoder. For example, the respective memory blocks MB0 through MB3 may be selected by decoding the most significant bit MSB and the second most significant bit MSB-1 in the address signal, and the column line may be selected by decoding an 8-bit column address signal CAj in which j=1, 2, . . . , 8.

The memory blocks MBi shown in FIG. 1 are divided into normal memory blocks BLKi and spare memory blocks SBLKi. A column decoder CD includes a normal column decoder NCD for activating column selecting lines CSLn which select column lines CLn in the normal memory blocks BLKi, and a spare column decoder SCD for activating spare column selecting lines SCSLm which select spare column lines SCLm in the spare memory blocks SBLKi.

As shown in FIG. 1, the column line CLn is shared by the column memory cells of the normal memory blocks BLK0 through BLK3, and the spare column line SCLm is shared by the spare column memory cells of the spare memory blocks SBLK0 through SBLK3. The normal column decoder NCD decodes the external column address signal CA and activates the column selecting line CSLn to select the column line CLn commonly connected to the column memory cell is of the memory blocks BLK0 through BLK3. This operation of the normal column decoder NCD is a standard addressing operation which is used in a general semiconductor memory device.

Still referring to FIG. 1, the spare column decoder SCD includes a plurality of fuses for programming the address of a defective memory cell. Spare column decoder SCD activates the spare column selecting line SCSLm which selects the spare column line SCLm commonly connected to the column memory cells of the spare memory blocks SBLK0 through SBLK3 when the address programmed by the fuses is input.

When the memory blocks BLK0 through BLK3 are arranged as shown in FIG. 1, defects may occur in normal memory cells on different column lines of the respective normal memory blocks BLK0 through BLK3. For example, in FIG. 1, the column lines in which defects occur are shown as DCL0 through DCL3. The defective column lines DCL0 through DCL3 are respectively repaired by the spare column lines SCL0 through SCL3 in the spare memory blocks SBLK0 through SBLK3. Thus, in the conventional method shown in FIG. 1, when a defect occurs in a memory cell in a predetermined normal memory block BLKi, a nondefective memory cell of another memory block which shares the same column with the defective memory cell is also repaired. Therefore, when repairing a defective memory cell, a nondefective memory cell which shares the same column line in the normal memory block with the defective memory cell also generally cannot be used.

When defects are present in memory cells which belong to different normal memory blocks and share the same column line, the efficiency of the spare memory block also generally decreases, since as many spare column lines as defective normal memory blocks are generally required. This problem will be explained in detail with reference to FIG. 2.

FIG. 2 is a circuit diagram showing a conventional column redundancy circuit as disclosed in U.S. Pat. No. 4,829,480, and includes a normal column decoder NCDn, a spare column decoder SCDm and a controlling circuit 100. FIG. 3 illustrates waveforms for explaining the operation of the device shown in FIG. 2.

Referring now to FIGS. 1, 2 and 3, a normal operation in which a defect is not present in a memory cell of the column line in the memory cell array MA will first be described. During normal operation, the main fuse MF in the controlling circuit 100 and the address program fuses F1, F1B . . . . F8, F8B in the spare column decoder SCDm are not blown or programmed. The control signal RST which is input to the controlling circuit 100 is a one shot pulse signal generated when a column address strobe signal CASB is activated. B is used to indicate a complementary signal to an original signal.

A node 402 of the controlling circuit 100 is maintained at the power supply voltage level Vcc by the main fuse MF which is not blown. Accordingly, since the transistor 32 is in the active state, the node 502 is maintained at a logic "low" state. The node 402 continuously maintains the power supply voltage Vcc level since the potential of the node 402 is not fully discharged during the duration of a "high" pulse of the control signal RST. Thus, since a logic "low" and logic "high" are supplied to lines 49 and 50, respectively, all the inputs of the NAND gate 45 are maintained as a logic "low", by discharge of transistors 43-1 through 43-8B. The spare column selecting line SCSLm is also in a logic "low" state.

The normal column decoder NCDn decodes column address signals CAj (where j=1, 2, . . . ,8) which are the output signals of a column address buffer (not shown), to activate a column selecting line CSLn. Therefore, in normal operation, the normal column selecting line CSLn is activated and the spare column selecting line SCSLm is inactive as shown in FIG. 3.

A redundancy operation which occurs when a defect occurs in a memory cell of a column line in the memory cell array MA will now be described. When the defective column is detected in the memory cell array MA of FIG. 1 as a result of a test, the defective memory cell is repaired by the following redundancy operation.

For a redundancy operation, the main fuse MF in the controlling circuit 100 is blown or programmed. The fuses among the program fuses in the spare column decoder SCDm, corresponding to the position of the defective column address, are also blown or programmed.

For example, if the column address signals CAj specifying the defective column line in the memory cell array MA are "00000000," the program fuses F8, F7, F6, F5, F4, F3, F2, and F1 corresponding to the column address signals CAj of the defective memory cell are blown or programmed. In this state, when the column address strobe signal CASB and the defective column address "00000000" are applied, a one shot pulse signal is applied to the controlling circuit 100 as described above.

Accordingly, since transistor 30 is activated and transistor 32 is deactivated in response to the control signal RST, the logic states of the nodes 402 and 502 in the controlling circuit 100 are "low" and "high," respectively. Thus, since the lines 49 and 50 are "high" and "low", respectively, discharge transistors 43-1 through 43-8B are deactivated.

Transfer gates T1, T1B, ..., T8 and T8B are all activated so that the column address signals CAj which are output from the column address buffer and address signals CAjB having a signal level which is complementary to the column address signals CAj, are transferred to one input terminal of the fuses F1, F1B ...., F8 and F8B.

Since the fuses F8, F7, F6, F5, F4, F3, F2, and F1 corresponding to the defective column address among the fuses F1, F1B, ..., F8 and F8B are blown, all the inputs to the NAND gate 45 become logic "high." Accordingly, the NAND gate 45 outputs a logic "low" Inverter 46 which is connected to the output node thereof outputs a logic "high," thereby activating a spare column selecting line SCSLm.

The output of the inverter 46 is also connected to an input of the normal column decoder NCDn. The output of the normal column decoder NCDn becomes logic "low," to deactivate the column selecting line CSLn. Thus, the column of the defective normal memory block is not selected, and the spare column of the spare memory block is selected.

In the device shown in FIG. 1, when defects are present in different column lines of the respective normal memory blocks BLK0 through BLK3, four column redundancy circuits shown in FIG. 2 are used. In particular, as shown in FIG. 1, the defective columns of the normal memory blocks BLK0 through BLK3 are respectively repaired by the spare column lines SCSL0, SCSL1, SCSL2 and SCSL3 in the spare memory blocks SBLK0 through SBLK3.

Thus, conventional column repairing generally requires many spare column lines, which can cause an increase in chip size. Also, due to the fact that a nondefective memory cell is repaired at the same time a defective memory cell is repaired, the efficiency of conventional repairs may be limited.

SUMMARY OF THE INVENTION

It is therefore an object of the present invention to provide improved redundancy repair systems and methods for integrated circuit memory devices.

It is another object of the present invention to provide redundancy repair systems and methods for integrated circuit memory devices which can reduce the number of redundant cells which are needed to repair defective cells.

These and other objects are provided, according to the present invention, in a memory cell array which includes a plurality of memory blocks, each of which includes normal memory cells and spare memory cells, arranged in arrays having rows and columns. According to the invention, a row or column of spare memory cells in one of the memory cell blocks is substituted for a defective row or column of normal memory cells in the one of the memory blocks, without substituting a row or column of spare memory cells in remaining ones of the memory cell blocks for a row or column of normal memory cells in the remaining ones of the memory blocks. Stated differently, a predetermined row or column of spare memory cells in a first one of the memory blocks is substituted for a first defective row or column of normal memory cells in the first one of the memory blocks, and the predetermined row or column of spare memory cells in a second one of the memory blocks is also substituted for a second defective row or column of normal memory cells in a second one of the memory blocks. Thus, a given row or column of spare memory cells can be used to substitute for different rows or columns of memory cells in each memory block. The number of spare memory cells which is required is thereby reduced.

In a general embodiment of the present invention, the memory blocks include shared columns and distinct rows. A spare column decoder is responsive to a block address signal and to a column address signal, to thereby substitute a column of spare memory cells in a first one of the memory blocks for a first column of defective normal memory cells in the first one of the memory blocks, and to substitute a corresponding column of spare memory cells in a second one of the memory blocks, for a second column of defective normal memory cells in the second one of the memory blocks. By allowing the same row or column of spare memory cells to substitute for different rows or columns of normal cells in each memory block, based on a block address signal, fewer rows or columns of spare memory cells are required. For example, if four memory blocks are present, a single row or column of spare memory cells can substitute for a defective row or column in each of the four memory blocks, rather than requiring a single row or column of spare memory cells to substitute for a single row or column of defective memory cells in a single block. In this example, a four to one reduction in the number of spare memory cells which are required may thereby be obtained. It will be understood that, as used herein, the terms "row" and "column" are used to indicate relative orthogonal directions in an array, and do not indicate fixed horizontal or vertical orientations in a memory device.

A specific embodiment of the present invention produces a block select signal which selects one among the plurality of memory blocks and produces a word line select signal which selects a word line of a normal memory cell in the selected memory block. Column addresses of defective column memory cells of the respective memory blocks are programmed so that a program address is output in response to an input of a defective column address. A defective column address is transferred to the defective address programmer corresponding to a memory block which is identified by the block select signal. An output of the programmer is enabled in response to a redundancy control signal. The program address which is output is then decoded, to thereby activate a spare column line corresponding to the normal memory cell of the identified memory block. The defective addresses may be programmed using first fuses which receive a column address signal and second fuses which receive a complementary column address signal. Transfer gates supply the column address signal and the complementary column address signal to the first fuses and the second fuses. A NAND gate decodes the signals which are output from the first and second fuses. An inverter which is responsive to the NAND gate activates a spare column selecting line which is connected to the output node thereof.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 3:
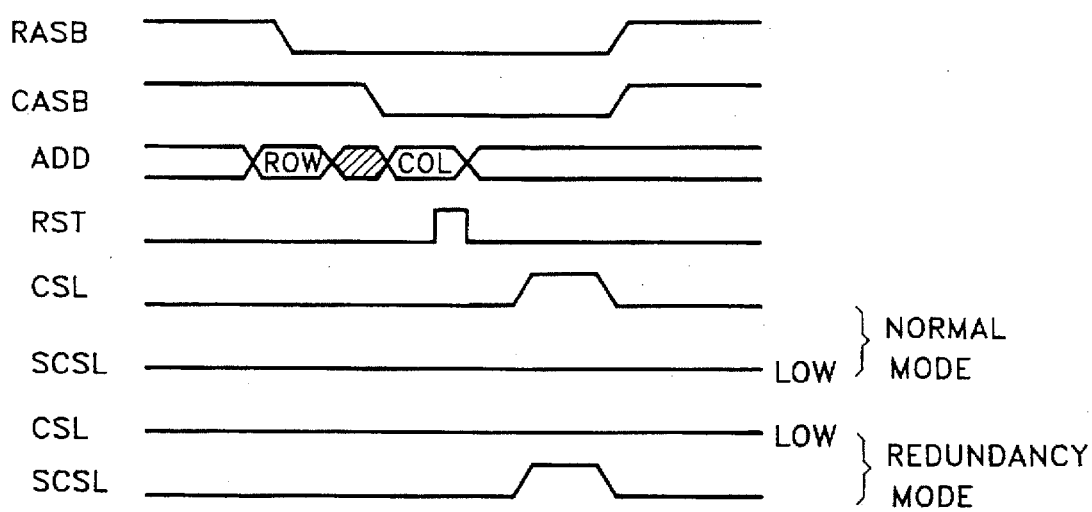
FIG. 3 illustrates waveforms showing a column repair operation of a general memory cell.

Operation of a preferred embodiment according to the present invention will now be described in detail with reference to FIGS. 3, 4, and 5.

Figure 1:
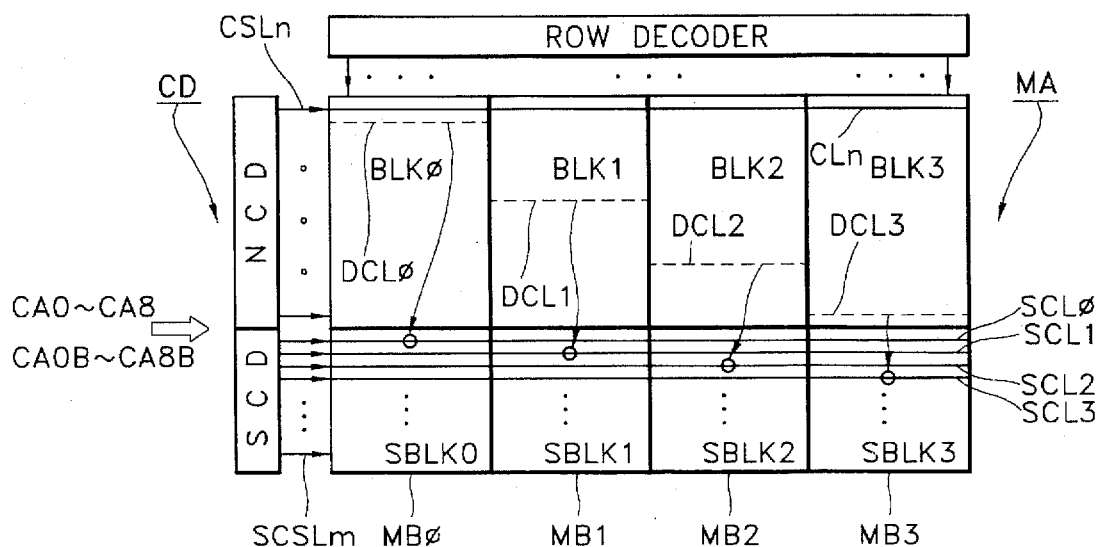
FIG. 1 is a block diagram of an integrated circuit memory device including a conventional method and system for repairing defective memory cells.
Figure 4:
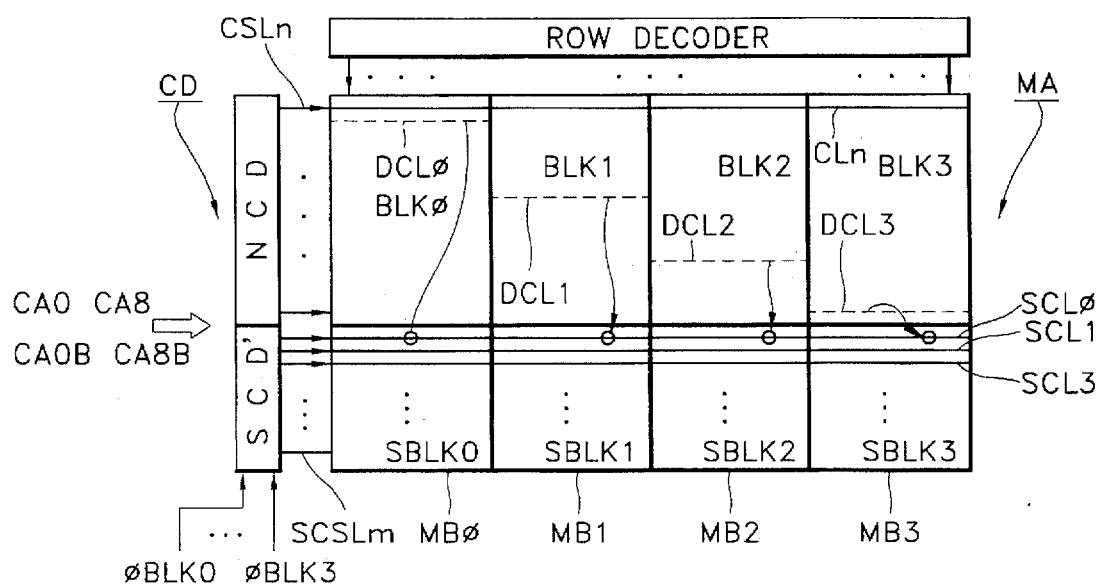
FIG. 4 is a block diagram of an integrated circuit memory device including a method and system for repairing defective memory cells according to the present invention.
Figure 2:
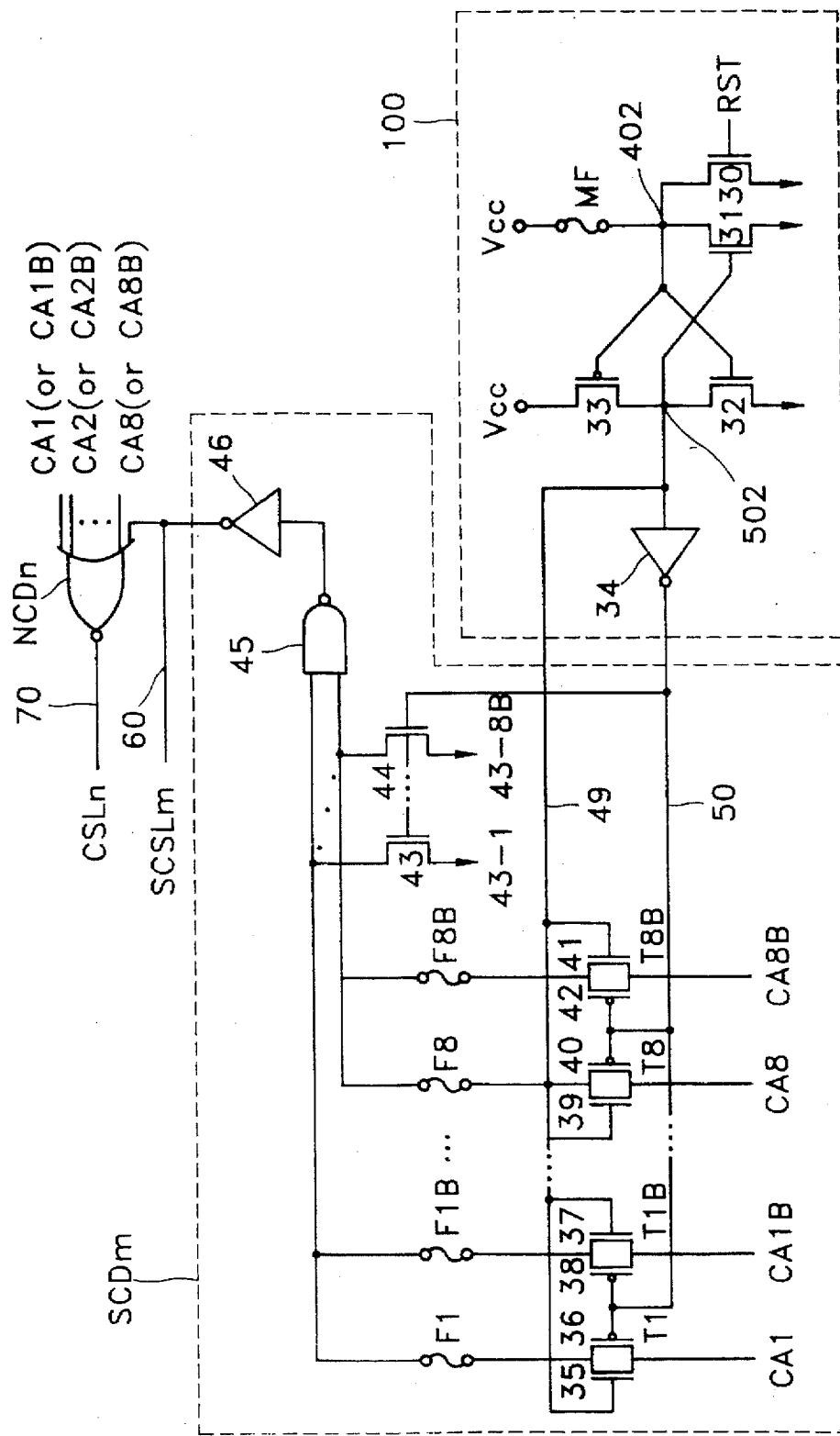
FIG. 2 is a circuit diagram of part of a spare column decoder of FIG. 1.

FIG. 4 is a block diagram of an integrated circuit memory device including a method and system for repairing defective memory cells, according to the present invention. In FIG. 4, when defects are present in memory cells on different column lines in respective normal memory blocks BLK0 through BLK3 of a memory cell array MA, such defective column memory cells are repaired by a spare column line shared by a plurality of memory blocks MB0–MB3 by operation of a spare column decoder SCD'. In particular, FIG. 4 shows an example in which the defective column line DCL0 of the normal memory block BLK0, the defective column line DCL1 of the normal memory block BLK1, the defective column line DCL2 of the normal memory block BLK2 and the defective column line DCL3 of the normal memory block BLK3 are all repaired by the spare column line SCL0.

In the spare column decoder SCD', the outputs of fuses, which program defective column addresses in the respective memory blocks MB0 through MB3, are used to repair the defective memory cell in a plurality of normal memory blocks BLKi by means of a spare column line SCLm, by being selected according to block select signals φBLK0 through φBLK3. This operation will be described in detail with reference to FIG. 5.

Figure 5:
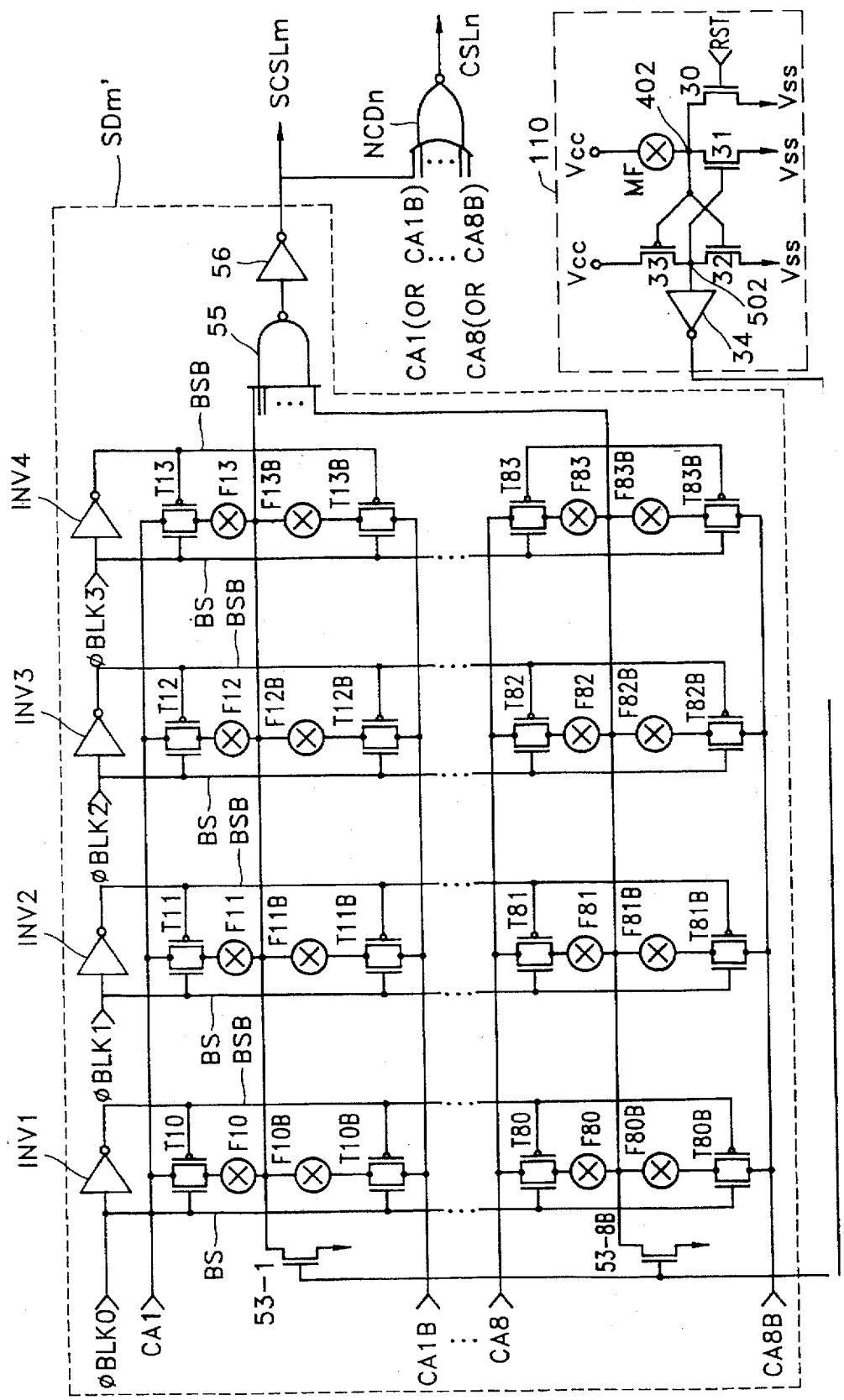
FIG. 5 is a circuit diagram of part of a spare column decoder of FIG. 4.

FIG. 5 is a circuit diagram showing part of a column redundancy circuit according to the present invention. The column redundancy circuit includes a controlling circuit 110, a normal column decoder NCDn, a plurality of fuses which can program defective column address signals CAj and a spare column decoder SCDm'. Spare column decoder SCDm' repairs different defective column lines in the plurality of memory blocks with a spare memory cell of a spare column line by inputting the block select signals φBLK0–φBLK3 for selecting one among the memory blocks.

The spare column decoder SCDm' includes a plurality of fuses Fji through FjiB and inverters INV1 through INV4 which operate as a defective address programmer, by programming defective column address signals CAj through CAjB (j=1, 2, ..., 7 and 8) of the normal memory block in which the defective memory cell is located. Transfer gates Tji through TjiB operate as defective address transmitters by responding to an activation of the block selecting line BS and the block selecting line BSB having a complementary signal level, to supply the input defective column address signals CAj through CAjB to an input node of the fuses Fji through FjiB.

A plurality of discharge transistors 53-1 through 53-8B form channels between an output node of the fuses Fji through FjiB in a plurality of defective memory cell selectors and a reference voltage, to operate as redundancy enablers by enabling the output of the fuses Fji through FjiB in a redundancy mode. A NAND gate 55 and an inverter 56 operate as a column selecting line activator by decoding the signal which is output from the output node of the fuses Fji through FjiB in the enabled plurality of defective memory cell selectors and by activating the spare column line corresponding to the defective memory cell in the relevant memory block. It will be understood however, that other electronic devices, including hardware logic or programmed software or combinations thereof, can operate as elements of a block redundancy repair circuit and steps of a block redundancy repair method. A spare column decoder such as that shown in FIG. 5, is included in each spare column line.

Referring to FIG. 5, column repairing shown in FIG. 4 will now be described in detail. First, operation of the normal mode in which a defect is not present in the memory cell of the column line in the memory cell array MA shown in FIG. 4 will be described.

When a defect is not present in the column lines in the memory cell array MA, a main fuse MF in the controlling circuit 110, and address programming fuses F10 through F83B corresponding to the respective memory blocks MBi, are not blown or programmed. When a controlling signal RST is input to the controlling circuit 110 as a logic "high," the node 402 connected to a drain terminal of an NMOS transistor 30 maintains a logic "high", and the node 502 connected to the drain terminal of a PMOS transistor 33 maintains a logic "low." Therefore, the inverter 34 connected to the node 502 supplies the signal at logic "high" (the redundancy control signal) to the gates of NMOS transistors 53-1 through 53-8B, which operate as a redundancy enabler.

Since the NMOS transistors 53-1 through 53-8B are activated in response to the output of the logic "high" from the inverter, a logic "low" is supplied to all the input nodes of the NAND gate 55. Therefore, the spare column selecting line SCSLm connected to the output node of the inverter 56 maintains a "low" state. The normal column decoder NCDn activates the column selecting line CSLn by decoding the column addresses CA8, CA8B ....., CA1 and CA1B which are output from the column address buffer (not shown).

Operation of the redundancy mode, in which a defect is present in a memory cell of a column line in a memory cell array MA shown in FIG. 4, will now be described. As a result of a test, when defective memory cells are detected in the memory cell array MA of FIG. 4, the defective memory cells are repaired by the following redundancy operation. It is assumed that the column address signals CAj of the defective memory cells are respectively "00000000," "00001111," "11110000" and "11111111" in the respective normal memory blocks BLK0, BLK1, BLK2 and BLK3, and are repaired by the spare column line SCLm.

The main fuse MF in the controlling circuit 110 is blown or programmed. The block select signals φBLK0 through φBLK3 which select one among the respective memory blocks MB0 through MB3, and the block select signals φBLK0B through φBLK3B inverted by the inverters INV1 through INV3, are input. The address programming fuses connected to the block selecting lines BS and BSB are blown or programmed, to correspond to the respective defective column address.

For example, to repair a defective memory cell on the column line in the normal memory block BLK0, fuses F80, F70, F60, F50, F40, F30, F20 and F10 are blown, and fuses F81, F71, F61, F51, F41, F31, F21 and F11 are blown to repair a defective normal memory block BLK1. Fuses F82B, F72B, F62B, F52B, F42B, F32B, F22 and F12 are blown to repair a defective normal memory block BLK2, and fuses F83B, F73B, F63B, F53B, F43B, F33B, F23B and F13B are blown to repair a defective normal memory block BLK3.

The column address strobe signal CASB (not shown) is activated and the address signal for selecting the column having the defect is input. For example, when the defective column address signals CAj corresponding to the defective column of the normal memory block BLK0 are applied as "11110000," the control signal RST applied to the controlling circuit 110 is generated as the pulse of logic "high", a predetermined time after the column address strobe signal CASB is activated, as shown in FIG. 3. When the control signal RST is input as a logic "high" after the main fuse MF in the controlling circuit 110 is blown, a logic "low" is output from the inverter 34 in the controlling circuit 110.

The precharging NMOS transistors 53-1 through 53-8B, the gates of which are connected to the output node of the inverter 34, are all deactivated, to enable the redundancy operation, by separating the potential of the output node of the respective fuses from a reference voltage, for example, ground potential Vss. In this state, if only the first block select signal φBLK0 is supplied as a logic "high" among the block select signals φBLK0 through φBLK3, and the rest of the block select signals φBLK1, φBLK2 and φBLK3 are continuously supplied as a logic "low," only the first memory block MB0 is activated among the memory blocks MB0–MB3 shown in FIG. 4 and the rest of the memory blocks MB1, MB2 and MB3 are deactivated.

If only the first memory block MB0 is activated, then only the transfer gates T10, T10B, ..., T80 and T80B, whose gates are connected to the block selecting lines BS and BSB of the output and input nodes of the inverter INV1 shown in FIG. 5, are activated. The transfer gates connected to the input and output nodes of the rest of the inverters INV2, INV3 and INV4, are deactivated. Therefore, the column address signals CAj are supplied to the input node of the programmed fuses F10, F10B, ..., F80 and F80B through the transfer gates T10, T10B ..... T80 and T80B, which are activated by the activation of the block select signal φBLK0 by block coding.

For example, assume fuses F80, F70, F60, F50, F40, F30, F20 and F10 are already blown or programmed. The precharge transistors 53-1 through 53-8B are thus deactivated. The complementary address signals CAjB ("11111111") of the defective column address signals CAj ("00000000"), which are output from the output nodes of the transfer gates T10B through T80B and the fuses F10B through F80B which are not blown, are directly input to the input node of the NAND gate 55.

Therefore, all the inputs of the NAND gate 55 are at logic "high" levels when the defective column address signals CAj ("00000000") of the memory block MB0 are input. Thus, the inverter 56 which is connected to the output node of the NAND gate 55, activates the spare column selection line SCSL0 which is connected to the spare column line SCL0 in the spare memory block SBLK0 of the memory block MB0. The defective memory cell located on the defective column line DCL0 of the normal memory block BLK0 is repaired. The output of the normal column decoder NCD0 is toggled "low", to be deactivated.

If only the second block select signal φBLK1 is supplied as a logic "high" among the block select signals φBLK0 through φBLK3 and the rest of the block select signals φBLK0, φBLK1 and φBLK3 are supplied as logic "low," only the second memory block MB1 is activated among the memory blocks MB0 through MB3 shown in FIG. 4. The rest of the memory blocks are deactivated.

By the above selection operation, a defective memory cell of the column line DCL1 in the second memory block MB1 is repaired by a spare memory cell. The spare memory cell is located on the spare column line SCL0 which also repairs the first memory block MB0. Only the position of the memory block is different, as can be seen from the following description.

When the block select signal φBLK1 is supplied as a logic "high", the transfer gates T11, T11B, T21, T21B, .... T81 and T81B, which transfer the column address signals CAj from the spare column decoder SCD' of FIG. 4 to the input of the NAND gate 55, are activated. The rest of the transfer gates are inactive.

Since the fuses F81B, F71B, F61B, F41B, F31B, F21B and F11B for programming the defective column address of the second memory block MB1 are blown and the precharge transistors 53-1 though 53-8B are deactivated, all the inputs of the NAND gate 55 are activated at a logic "high" level. The spare column selecting line SCSL0 is activated at a logic "high" level, and the normal column selecting line CSL1 is deactivated at a logic "low" level. Thus, the column having the defect is replaced with the spare column by the redundancy circuit.

Therefore, it can be seen that a defect in a column line which is generated at different positions of the different memory blocks, is repaired by the spare column decoder as shown in FIG. 5, using one column selecting line.

The present invention is not restricted to the embodiment shown in FIG. 5, and it is clearly understood that many variations can be possible within the scope and spirit of the present invention by one skilled in the art. For example, only one controlling circuit 110 may be included when a plurality of spare column decoders exist. Alternatively, as many controlling circuits 110 as spare column decoders can be included. Also, a device which can program the address or an electrically programming method can be used as the fuses. The transfer gates T10, T10B, ..., T83 and T83B may also include transistors of a specific type. The memory block can also be divided into two, eight or more, based on the design of the row decoder.

As described above, the redundancy repair circuits and methods according to the present invention can repair a defect of a row and/or column generated in the plurality of memory blocks with only one spare row and/or column in a semiconductor memory device which includes a plurality of memory blocks, thus efficiently repairing the row and/or column without increasing chip size.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. An integrated circuit memory device, comprising:

a memory cell array including a plurality of memory blocks, each having normal memory cells and spare memory cells;

decoding means for producing a block select signal which selects one among said plurality of memory blocks and for producing a word line select signal which selects a word line of a normal memory cell in said selected memory block;

a plurality of defective address program means, a respective one of which programs column addresses of defective column memory cells of a respective memory block, for outputting a program address in response to input of a defective column address;

defective address transfer means for transferring a defective column address to one of said defective address program means corresponding to a memory block which is identified by the block select signal;

redundancy enable means for enabling an output of said plurality of defective address program means in response to a redundancy control signal; and spare column selecting line activating means for decoding the program address which is output from said defective address program means in response to said block select signal and for activating a spare column line corresponding to the normal memory cell of the respective memory block.

2. An integrated circuit memory device according to claim 1, further comprising a normal column decoder for decoding column address signals from an address buffer, and for selecting a column line of the normal memory cell of said selected memory block.

3. An integrated circuit memory device according to claim 1 wherein said plurality of defective address program means comprises:

fuse means having a common output node which is connected to an input node of said spare column select line activating means, said fuse means including first fuses which receive said column address signal and second fuses which receive a complementary column address signal; and a plurality of transfer gates, responsive to said block select signal, for supplying said column address signal and said complementary column address signal to said first fuses and to said second fuses.

4. An integrated circuit memory device according to claim 3, wherein said spare column selecting line activating means comprises:

a NAND gate which decodes said first and second fuses; and an inverter responsive to said NAND gate, and activating a spare column selecting line.

* * * * *